(12) United States Patent  
Wolf et al.

(10) Patent No.: US 7,358,982 B2
(45) Date of Patent: Apr. 15, 2008

(54) IMAGING DEVICE FOR A PRINTING PRESS

(75) Inventors: Thomas Wolf, Karlsruhe (DE);
Bernhard Zintzen, Heidelberg (DE);
Karl Wisspeintner, Ortenburg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 266 days.

(21) Appl. No.: 10/958,929

(22) Filed: Oct. 5, 2004

(65) Prior Publication Data
US 2005/0078167 A1    Apr. 14, 2005

(30) Foreign Application Priority Data
Oct. 14, 2003    (DE) ................. 103 47 557

(51) Int. Cl.
*B41J 15/14*    (2006.01)
*B41J 27/00*    (2006.01)
(52) U.S. Cl. ....................... 347/244; 347/258
(58) Field of Classification Search ........ 347/241–244, 347/256–258; 359/811–814, 823–826, 383, 359/425, 426; 310/90.5; 396/449, 463, 396/464; 355/53
See application file for complete search history.

(56) References Cited

U.S. PATENT DOCUMENTS

| | | | |
|---|---|---|---|
| 4,390,262 A * | 6/1983 | Hirohata et al. ............. | 396/449 |
| 5,146,242 A | 9/1992 | Zielinski ..................... | 346/108 |
| 5,248,992 A | 9/1993 | Ferschl ........................ | 346/76 |
| 5,257,038 A | 10/1993 | Ferschl et al. ............... | 346/76 |
| 6,043,863 A * | 3/2000 | Ikeda ........................... | 355/53 |
| 6,097,552 A * | 8/2000 | Gordon et al. ............... | 359/814 |
| 6,195,154 B1 | 2/2001 | Imai ............................ | 355/53 |
| 6,559,568 B2 * | 5/2003 | Maejima et al. ........... | 310/90.5 |
| 2002/0167584 A1 | 11/2002 | Zelenka ..................... | 347/234 |
| 2003/0090731 A1 | 5/2003 | Knopf ........................ | 358/3.32 |
| 2004/0136094 A1 | 7/2004 | Forrer et al. ................ | 359/732 |

FOREIGN PATENT DOCUMENTS

| | | |
|---|---|---|
| DE | 199 30 628 | 2/2001 |
| DE | 101 22 484 | 11/2002 |
| DE | 102 48 153 | 5/2003 |
| DE | 102 33 491 | 2/2004 |
| JP | 59 229 749 | 12/1983 |
| JP | 04 212 914 | 8/1992 |

* cited by examiner

*Primary Examiner*—Hai Pham
(74) *Attorney, Agent, or Firm*—Davidson, Davidson & Kappel, LLC

(57) ABSTRACT

An imaging device (10) for a printing form (12), in particular in a printing unit (82) of a printing press (84), having at least one light source (14) and an imaging optics (18) for projecting the at least one light source (14) onto the printing form (12), at least one optical element (20), in particular a lens, of the imaging optics (18), being movable by way of an actuator element (48), and the imaging optics (18) including one sensor (24) for measuring the actual position of the optical element (20), the sensor having one coil (26) and at least one sensor target (28). The sensor (24) is assigned to a control element (66) for adjusting the position of the optical element (20) via the actuator element (48), so that a highly precise, dynamic positioning of the optical element (20) can be achieved.

24 Claims, 4 Drawing Sheets

IMAGING DEVICE FOR A PRINTING PRESS

This claims the benefit of German Patent Application No. 103 47 557.5, filed Oct. 14, 2003 and hereby incorporated by reference herein.

BACKGROUND

The present invention is directed to an imaging device for a printing form, having at least one light source and one imaging optics for projecting the at least one light source onto the printing form, at least one optical element of the imaging optics being movable by way of an actuator element.

When printing forms, printing-form precursors, so-called masters or the like (all referred to in the following, in short, as printing forms) are imaged, whether it be in a printing-form imagesetter or in a printing unit of a printing press, using one or more light beams, which are projected by an imaging optics onto the surface of the printing form, it is necessary to bring one partial area of the printing form surface to be imaged into correspondence with the image area of the imaging optics in such a way that the focus of the light beam or the foci of the light beams is/are substantially disposed on the surface of the printing form, to enable energy to be supplied in a controlled manner, in particular with a defined intensity, to a specific surface. This objective is often achieved by shifting the focus of the imaging optics, in that the position of an optical element, in particular of a lens, is varied in the imaging optics.

From U.S. Pat. Nos. 5,146,242 and 5,248,992, an imaging device is known, for example, whose imaging optics has a variable focus. A plunger coil actuator makes it possible to change the position or location of a lens in such a way that it is displaced along the optical axis of the imaging optics, the focus of the imaging optics being displaced in the process. The light emitted by the imaging optics and directed at the surface of an object to be imaged is measured as it is reflected back into the imaging optics, so that a control signal or feedback control signal can be generated for the plunger coil actuator.

The prior German Patent Application No. DE 102 33 491.9, respectively, the prior U.S. Patent Publication No. 2004/0136094 describe another imaging device having a variable focus for a printing form. These two documents are hereby incorporated in their entirety by reference herein. The imaging device includes an imaging optics having a number of lenses positioned along an optical axis, through which the optical path from a light source, in particular from an array of individually addressable laser diodes, runs at least twice to a printing form. After passing through the lenses, the optical path is folded by a mirror, so that the light propagates through the lenses once more, in particular in the opposite direction. At least one of the lenses is designed to be movable along the optical axis. The imaging device includes a device, for example in the form of a triangulation sensor, for determining the distance between the imaging device and the printing form. On the basis of a distance measurement, the position of the movable lens can be controlled or regulated in such a way that the focus of the imaging optics is situated on the surface of the printing form to be imaged.

Since the surface of a printing form having a multiplicity of image spots is imaged in a short period of time, a highly dynamic, but, at the same time, very precise actuator (typically more precise in the micrometer range) must be used for positioning and guiding an optical element, in particular a lens, to enable the position of the optical element to be adjusted very quickly and exactly. An actuator of this kind does, in fact, make possible a correct displacement by a specific amount in relation to the just assumed actual position of the optical element, however, the displacement can only be precise to the extent that the actual position of the optical element is also already correct for the imaging operation.

SUMMARY OF THE INVENTION

An object of the present invention is to precisely determine the actual position of a movable optical element of an imaging optics of an imaging device.

In accordance with the present invention, an imaging device for a printing form, having at least one light source, in particular a number of light sources, and an imaging optics for projecting the at least one light source at the printing form, at least one optical element, preferably exactly one optical element of the imaging optics, being movable by way of an actuator element, and the imaging optics including one sensor for measuring the actual position of the optical element, the sensor having one coil and at least one sensor target or a sampling element.

A highly precise (micrometer-precise) positioning of the optical element may be advantageously achieved for imaging the printing form, in particular in connection with a focusing of the imaging optics at a partial area of the printing form surface, since an analog or digital signal, which is a measure of the actual position of the optical element, may be generated by the sensor, enabling this information to be used for controlling or regulating the actuator element. In particular, the positioning operation may be carried out dynamically.

One preferred light source is a laser light source, in particular a laser diode or a solid-state laser. If more than one light source is used, the light sources of the number of light sources are individually addressable, i.e., each one may generate optical output power that differs from that of the others. A plurality of laser light sources may be integrated on a bar, in particular in a row, or on a grid. The imaging optics may include optical elements, which act on all of the number of light sources (macro-optical elements), and may include optical elements, which act in each instance only on one of the number of light sources (micro-optical elements). The printing form may be plate-shaped or sleeve-shaped. The printing form may be detachably or removably accommodated on a printing-form cylinder or printing-form carrier element. The imaging device, more precisely the image spots produced by the imaging device, and the surface of the printing form, respectively the printing-form cylinder or printing-form carrier element are movable in relation to one another. The printing form is preferably rotatable about an axis, and the imaging device is substantially translatable in parallel to the axis of rotation, the movements being coordinated with one another in such a way that all partial areas or printing dots to be imaged on the surface of the printing form may be reached by the image spots of the light sources of the imaging device. The actuator element is preferably a plunger coil actuator, but may also be a linear actuator, a servomotor having a gear, or the like.

The coil of the sensor of the imaging device may be unsupported or wound around a tube; the coil in particular, especially the tube, may be centered around the optical axis of the imaging optics. These designs have the advantage of providing a central passage for light, even given little available space.

In one advantageous specific embodiment of the imaging device according to the present invention, the sensor is positioned symmetrically around the optical axis of the imaging optics, and/or the sensor is annular. Moreover, the actuator element, in particular the plunger coil actuator may be designed to be rotationally symmetrical. This lessens the danger inherent in asymmetrical sensors, of the axis of motion tilting in response to a highly dynamic, rapid motion. The required guidance precision is able to be better maintained in the dynamic case.

In one imaging device according to the present invention, the sensor, and, as the case may be, the coil, may be positioned around the at least one sensor target. In particular, the coil may run completely around the sensor target. In addition or alternatively thereto, the sensor may have a number of symmetrically disposed coil taps, in particular three taps, each offset by 120 degrees on a 360-degree coil.

In the imaging device according to the present invention, the optical element and the at least one sensor target are accommodated on a central tube in a compact design and in a simple integration. In this context, the wall thickness of the central tube is preferably greater than the penetration depth of the eddy currents of the coil.

The sensor target may have different designs; of considerable importance is a good contrast in the electromagnetic properties of the material, in particular in the permeability. A low magnetic persistence is especially beneficial. The sensor target may have sections of materials of different permeability, such as the air/aluminum or mu-metal/aluminum combinations. Preferably, the sensor target includes at least one air gap in the central tube.

In one especially preferred specific embodiment of the imaging device according to the present invention, the at least one optical element is a refractive optical element, in particular a lens. In one particular specific embodiment, as proceeds from German Application No. DE 102 33 491.9 and U.S. Patent Publication No. 2004/0136094, which are incorporated herein by reference, the imaging optics includes a mirror, which is axisymmetrical to the lens; in particular the mirror may be plane.

The optical element may be supported by membranes. In the case of a lens, two membranes are preferably used. In this context, a large membrane spacing is particularly advantageous, since this provides a good guidance for the optical element.

In one preferred specific embodiment of the imaging device, the sensor is assigned to a control element for adjusting the position of the optical element via the actuator element, in particular the plunger coil actuator. The control element obtains the setpoint position of the optical element as a function of the measured actual distance of the imaging device and of the partial area of the surface of the printing form, either from a processing unit or by determining the same. The position is preferably controlled using a controller having feed forward and noise compensation. The control element includes, in particular, a state-space controller for determining the necessary voltage for a setpoint position of the optical element and a monitoring element for calculating the velocity and the current from the actual position measurement of the sensor.

The imaging device according to the present invention may be used advantageously in a printing-form imagesetter or in a printing unit. The printing-form imagesetter may have a cylinder for accommodating a printing form, a printing-form precursor (which, following the image-setting is still processed), or a master, or be an in-drum imagesetter. A printing unit according to the present invention is distinguished by at least one imaging device according to the present invention and may be a direct or indirect planographic printing unit, a gravure printing unit, a flexographic printing unit, an offset printing unit, a dry offset printing unit or the like. A printing unit according to the present invention may be used quite advantageously in a printing press. A printing press according to the present invention features at least one printing unit according to the present invention and may be a web-fed or a sheet-fed press. Typical printing substrates include paper, cardboard, carton, organic polymer sheeting or fabric, or the like. A web-fed printing press may include an automatic reelchange, a number of printing towers having upper and lower printing units (typically four printing units), a dryer, a cooler, and a folding apparatus. A sheet-fed printing press may be a straight printing and a perfecting press, and may have a feeder, a number of printing units (typically four, six, eight or ten), and optionally a surface-finishing unit (punching unit, varnishing system or the like), and a delivery unit.

BRIEF DESCRIPTION OF THE DRAWINGS

Further advantages, advantageous embodiments and refinements of the present invention are described with reference to the following figures, as well as their descriptions. Specifically shown is in.

DETAILED DESCRIPTION OF A PREFERRED EMBODIMENT

Figure 1:
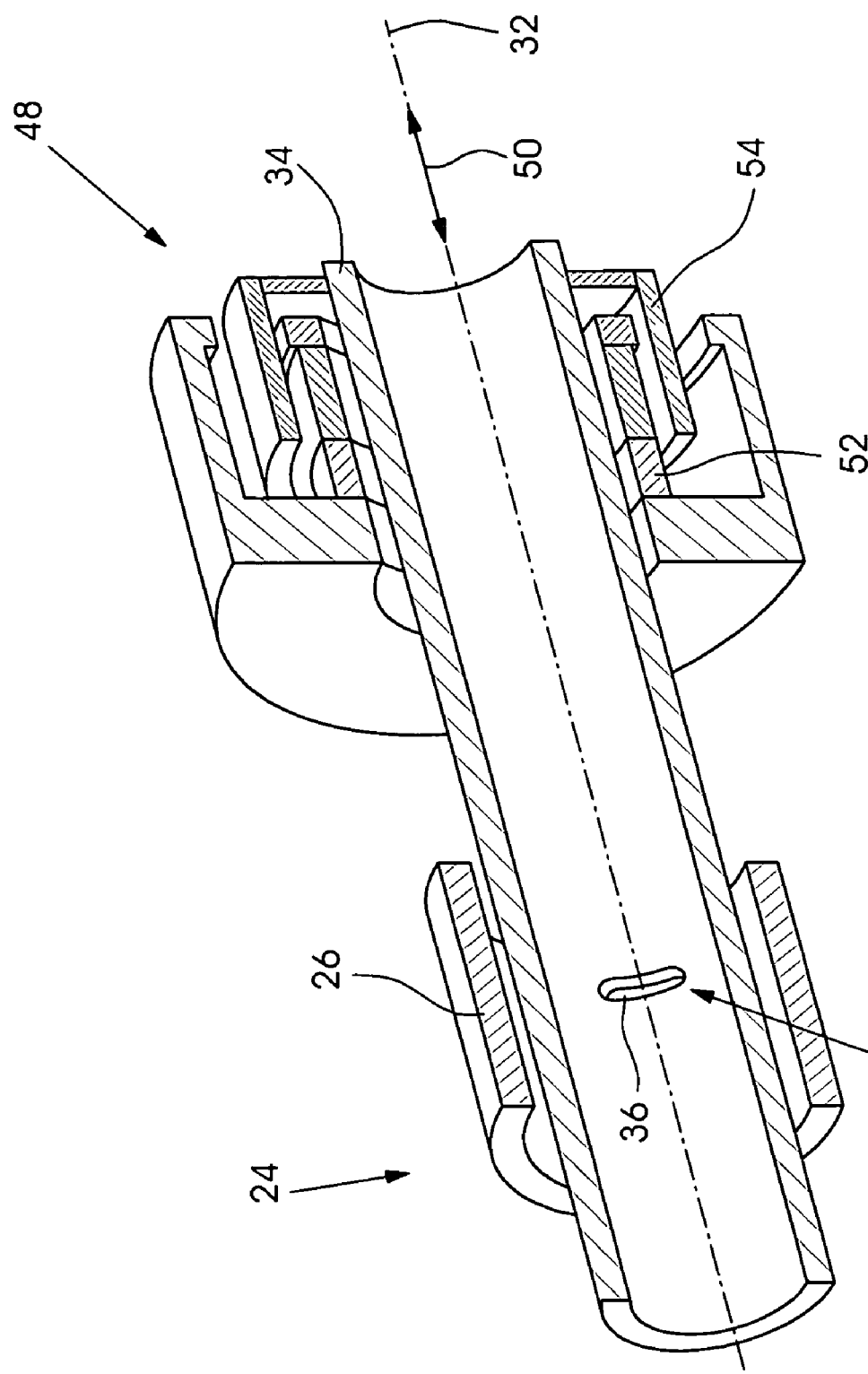
FIG. 1 a representation of the principal arrangement of the actuator element and sensor in one preferred specific embodiment of the imaging device according to the present invention.

FIG. 1 illustrates the fundamental arrangement of actuator element 48 and sensor 24 in one preferred specific embodiment of the imaging device according to the present invention. In this assembly, central tube 34, which is movable in translational direction 50 and whose axis of symmetry runs substantially in parallel to optical axis 32 of the imaging device (see FIG. 3), fulfills the function of coil carrier, of sensor target 28, and of carrier of the optical element (see FIG. 2). Actuator element 48 includes a magnetic circuit 52 or magnetic ring and a plunger coil 54. Sensor 24 has a coil 26 and is symmetrical and compact and is situated with only little space between the bearing positions of central tube 34. In one compact design of this kind, tolerances are minimized. Central tube 34 may also be conceived as a sliding rod of actuator element 48. The radial symmetry had the advantage, inter alia, that errors in the guidance precision of central tube 34, for example due to asymmetric mass distribution, are avoided, and measuring errors caused by tilting of coil 26 in relation to sensor target 28 are compensated. Various designs are possible for sensor target 28; of decisive importance are a good permeability contrast of the material and a low magnetic persistence. The illustrated sensor has a plurality of air gaps 36, visible here in FIG. 1 are so-called target slots in the central tube. Thus, the permeability contrast is effected by the air/aluminum material pair. The width of air gaps 36 amounts to the distance of coil taps of coil 26 of sensor 24. The method of functioning of the actuator element in the static case may be summarized briefly as: In response to current flowing into plunger coil 54 in magnetic circuit 52, an axial force is produced, which acts counter to the bearing support of central tube 34 (see FIG. 2). The spring stiffness of the bearing support determines the path displacement resulting from the force. With regard to sensor 24, it should be mentioned that coil 26 is operated with alternating current. When sensor target 28 is moved in relation to coil 26, individual coil segments are influenced by the eddy current effect.

Figure 2:
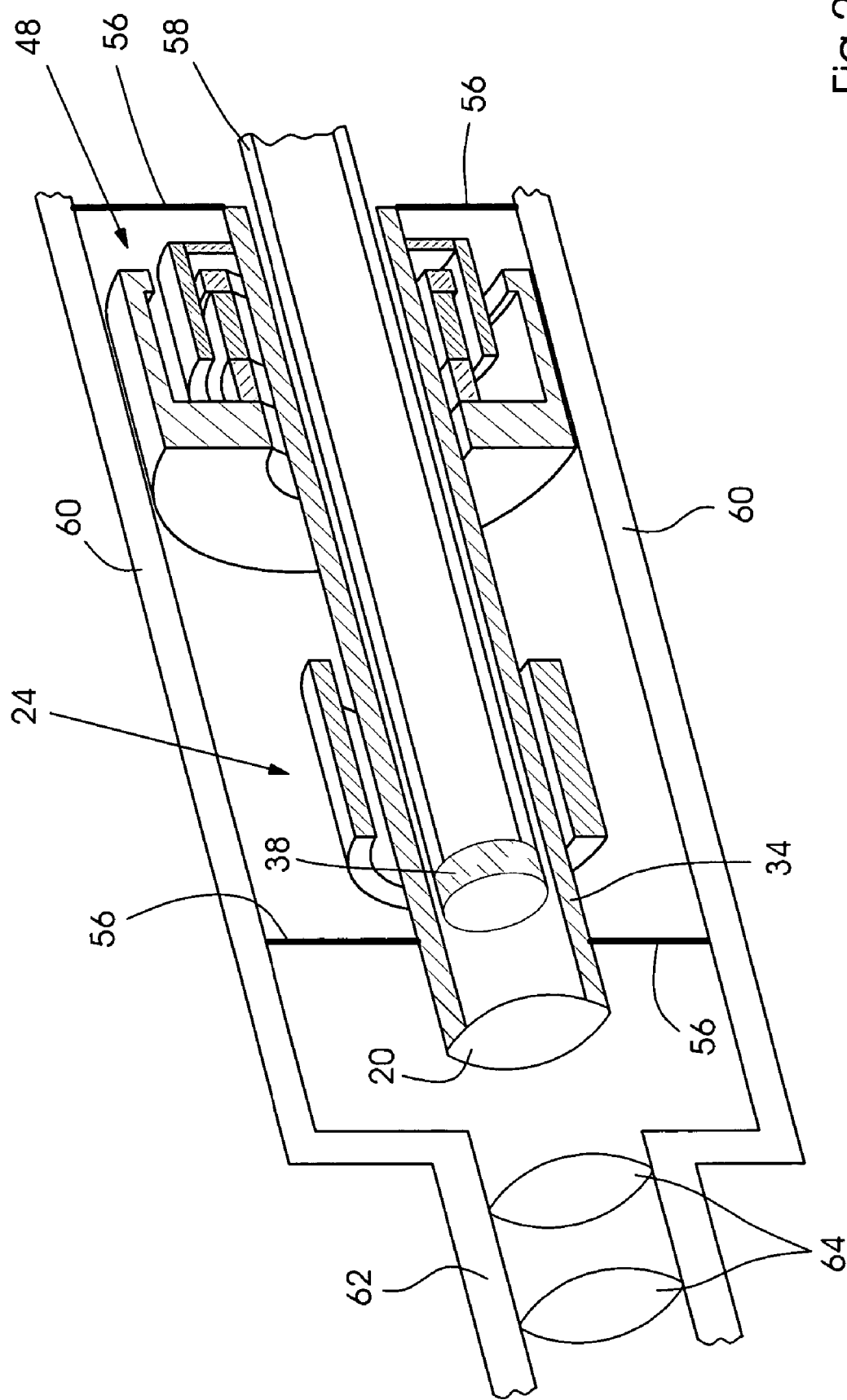
FIG. 2 a view of the movable optical element having the actuator element and sensor in one preferred specific embodiment of the imaging device.

FIG. 2 is a view of movable optical element 20, in this case a lens, having actuator element 48 and sensor 24, in one preferred specific embodiment of the imaging device. Central tube 34, on which the lens is accommodated, surrounds a mirror holder 58, which accommodates a mirror 38 directly behind the lens. As already described with reference to FIG. 1, central tube 34 may be moved substantially in parallel to the optical axis of the imaging optics. In the specific embodiment shown in FIG. 2, central tube 34 is supported in two membranes 56, counter to whose spring stiffness the translational motion of central tube 34 takes place. Membranes 56 support the central tube and thus optical element 20 in housing 60. Sensor 24 has an adjustable design to enable it to be axially calibrated with respect to air gaps 36 and housing 60. Housing 60 also bears an optics-holding element 62, which holds additional lenses 64 directly in front of movable optical element 20. In the preferred specific embodiment, additional lenses 64 are fixed in their position. The motion of central tube 34 controlled by actuator element 48 may take place without disturbing the optical path. In other words, actuator element 48 renders possible an unencumbered beam path through its movable part.

Figure 3:
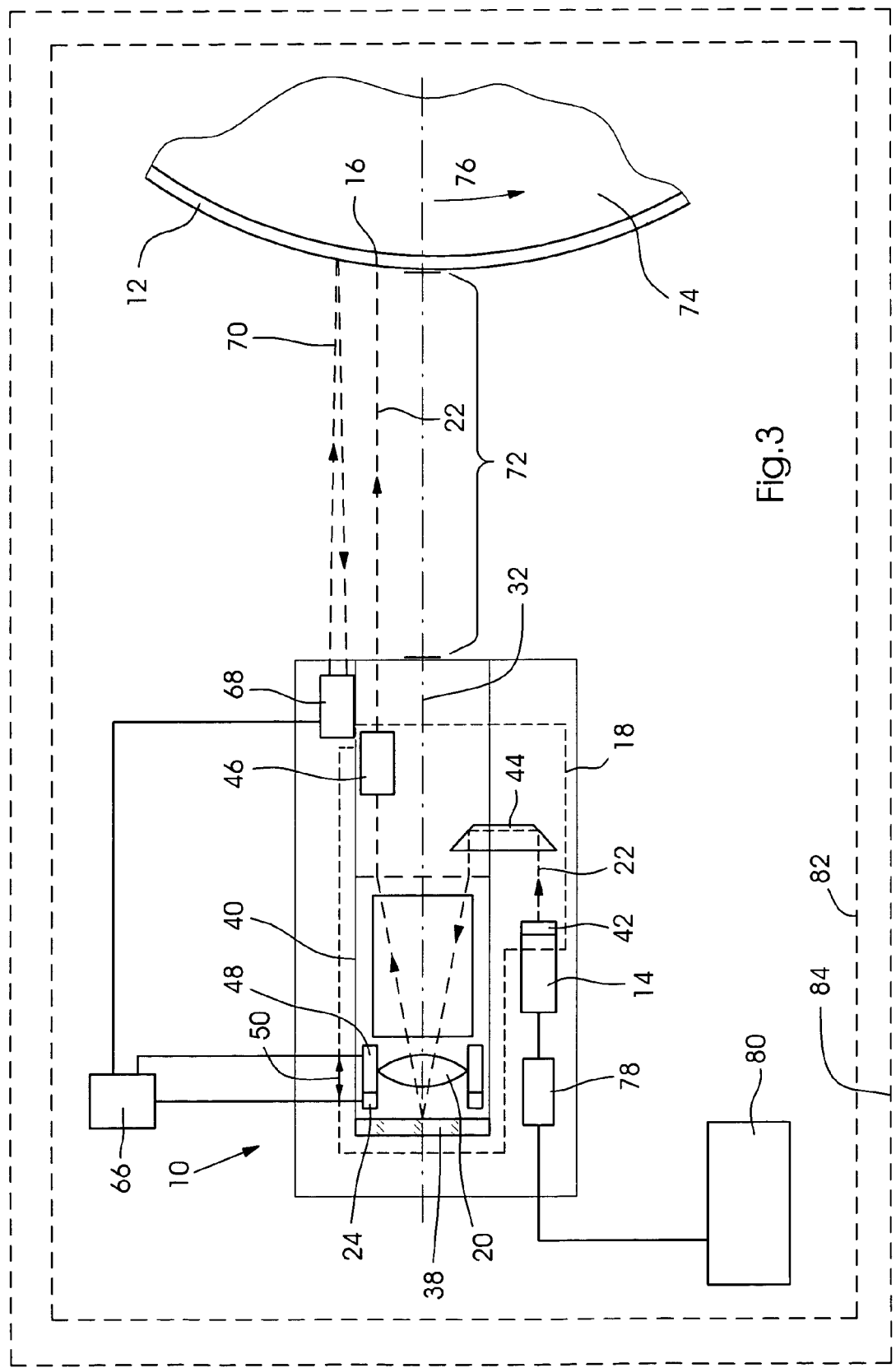
FIG. 3 a schematic representation of one preferred specific embodiment of the imaging device for imaging a printing form accommodated on a printing-form cylinder.

FIG. 3 is a schematic representation of an advantageous specific embodiment of imaging device 10 according to the present invention for a printing form 12 on a printing-form cylinder 74 in a printing unit 82 of a printing press 84. An imaging device 10 of this kind may also be accommodated in a printing-form imagesetter. Imaging device 10 includes an imaging optics 18 having a movable optical element 20. The beams from a number of light sources 14, here individually addressable diode lasers on a bar, are shaped by a micro-optics 42 (preferably in two parts, a first part acting in the sagittal and a second part in the meridional direction), and are subsequently coupled via a Porro prism 44 into a macro-optics 40 having a mirror 38. Optical path 22 propagates through macro-optics 40 twice and subsequently passes through correction optics 46. Light sources 14 are projected onto image spots 16 on printing form 12. To determine the position of printing form 12 in comparison to the focal position of the imaging optics of imaging device 10, an integrated triangulation sensor 68 is provided. Alternatively to triangulation sensor 68, other suitable distance-measurement devices may also be used in other specific embodiments. Sensor light 70 or the measuring beam is reflected at the surface of printing form 12, making possible a distance determination. From this measurement, inferences may be made about distance 72, in particular by automatic calculation. The surface of the printing form may have marked curvatures on the order of several 100 micrometers ("plate bubble") so that the focal position is changed via movable optical element 20, in this case a lens. Triangulation sensor 68 may take a measurement of printing form 12 at one location that is only reached at a later point in time in the image field of image spots 16 as the result of rotation of printing form cylinder 74 in direction of rotation 76. This location may also be offset from image spot 16 along the axis of printing form cylinder 76. The number of light sources 14 is connected to a laser driver 78 which is operatively connected to a control unit 80. As already elucidated with reference to FIGS. 1 and 2, optical element 20 is movable via an actuator element 48 in translational direction 50. The actual position of optical element 20 is measured by a sensor 24 and transmitted to a control element 66. Triangulation sensor 68 is linked to control element 66, so that a setpoint positional value for optical element 20 is able to be determined. The setting element of control element 66 is actuator element 48 for moving optical element 20.

Figure 4:
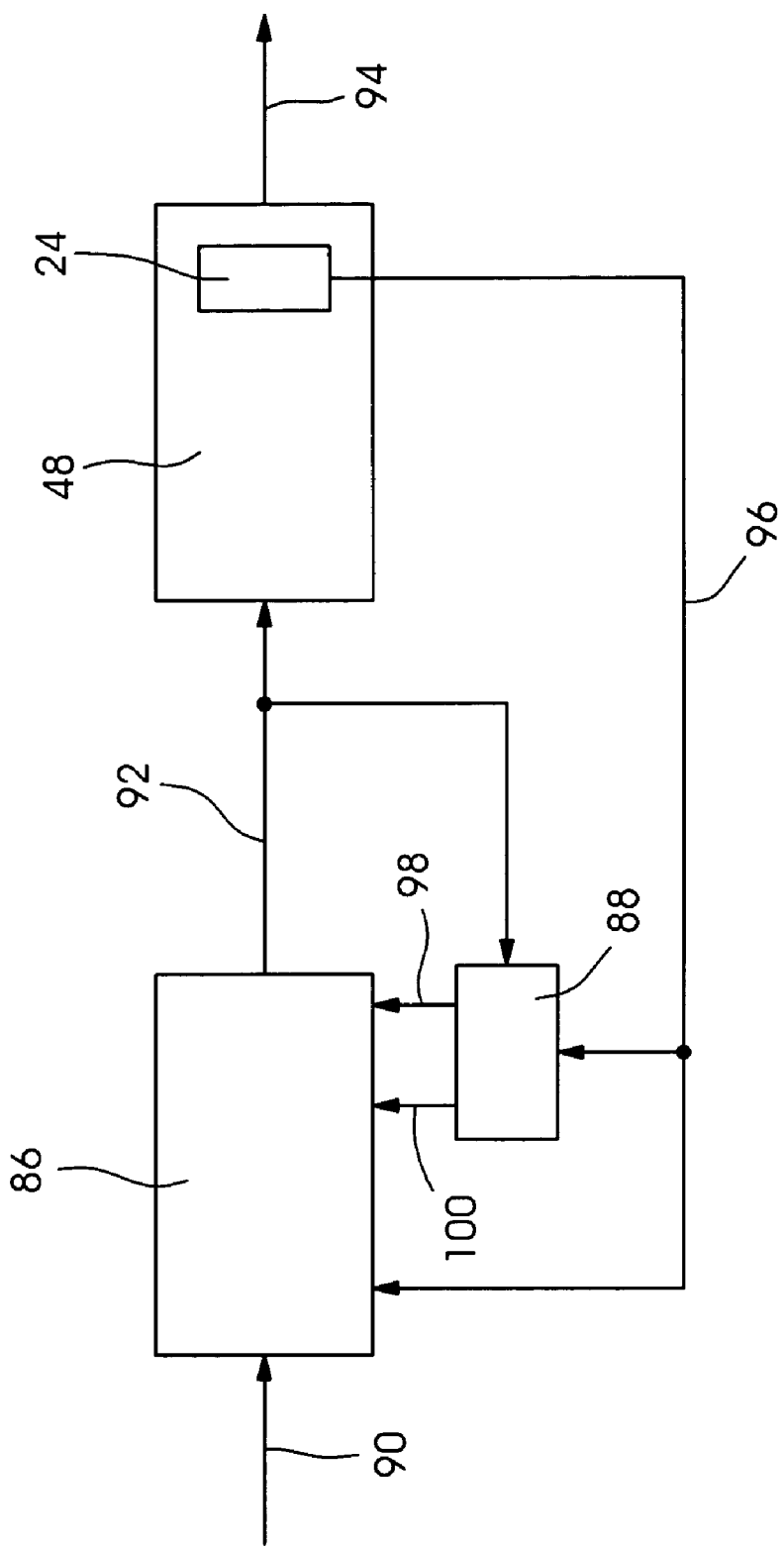
FIG. 4 one advantageous controller concept for positioning the optical element.

FIG. 4 illustrates one advantageous controller concept for positioning the optical element. A setpoint position 90 is supplied to a state-space controller 86 to enable it to determine a voltage 92 for actuator element 48. In response to actuation of actuator element 48, an actual position 94 of the optical element is effected. This actual position is measured by sensor 24. The measured actual position is fed both to state-space controller 86, as well as to a monitoring element 88. From the actual-position feedback or path-position feedback of sensor 24 and from voltage 92 output by state-space controller 86, monitoring element 88 calculates a current 98 and a velocity 100. From actual position 96 (the path displacement), current 98, and velocity current 100, state-space controller 86 determines the voltage needed to adjust setpoint position 90.

REFERENCE NUMERAL LIST 10 imaging device
12 printing form
14 light source
16 image spot
18 imaging optics
20 optical element
22 optical path
24 sensor
26 coil
28 sensor target
32 optical axis
34 central tube
36 air gap
38 mirror
40 macro-optics
42 micro-optics
44 Porro prism
46 telescope
48 actuator element
50 translational direction
52 magnetic circuit
54 plunger coil
56 membrane
58 mirror holder
60 housing
62 optics-holding element
64 additional lenses
66 control element
68 triangulation sensor
70 sensor light
72 distance
74 printing-form cylinder
76 direction of rotation
78 laser driver 80 control unit
82 printing unit
84 printing press
86 state-space controller
88 monitoring element
90 setpoint position
92 voltage
94 actual position
96 measured actual position
98 calculated current
100 calculated velocity

What is claimed is:

1. An imaging device for a printing form, the imaging device comprising:
    a light source;
    an actuator element;
    an imaging optics for projecting the light source onto the printing form, the imaging optics including at least one optical element movable by the actuator element, the imaging optics including a sensor for measuring an actual position of the optical element, the sensor having a coil and a sensor target; and
    a central tube, the optical element and the sensor target being accommodated on the central tube, wherein a wall thickness of the central tube is greater than a penetration depth of eddy currents of the coil.

2. The imaging device as recited in claim 1 wherein the coil is centered around an optical axis of the imaging optics.

3. The imaging device as recited in claim 1 wherein the sensor is positioned symmetrically around the optical axis of the imaging optics.

4. The imaging device as recited in claim 1 wherein the sensor is annular.

5. The imaging device as recited in claim 1 wherein the sensor is arranged around the sensor target.

6. The imaging device as recited in claim 1 wherein the sensor has a plurality of symmetrically disposed coil taps.

7. The imaging device as recited in claim 1 wherein the central tube is movable via the actuator element.

8. The imaging device as recited in claim 1 wherein the optical element is a lens.

9. The imaging device as recited in claim 1 wherein further comprising membranes supporting the optical element.

10. The imaging device as recited in claim 1 further comprising a control element assigned to the sensor for adjusting the position of the optical element via the actuator element.

11. A printing press comprising at least one printing unit as recited in claim 10.

12. A printing unit comprising at least one imaging device as recited in claim 1.

13. An imaging device for a printing form, the imaging device comprising:
    a light source;
    an actuator element;
    an imaging optics for projecting the light source onto the printing form, the imaging optics including at least one optical element movable by the actuator element, the imaging optics including a sensor for measuring an actual position of the optical element, the sensor having a coil and a sensor target; and
    a central tube, the optical element and the sensor target being accommodated on the central tube;
    wherein the sensor target includes an air gap in the central tube.

14. The imaging device as recited in claim 13 wherein the optical element is a lens, and the imaging optics includes a mirror axisymmetrical to the lens.

15. The imaging device as recited in claim 13 wherein the coil is centered around an optical axis of the imaging optics.

16. The imaging device as recited in claim 13 wherein the sensor is positioned symmetrically around the optical axis of the imaging optics.

17. The imaging device as recited in claim 13 wherein the sensor is annular.

18. The imaging device as recited in claim 13 wherein the sensor is arranged around the sensor target.

19. The imaging device as recited in claim 13 wherein the sensor has a plurality of symmetrically disposed coil taps.

20. The imaging device as recited in claim 13 wherein the central tube is movable via the actuator element.

21. The imaging device as recited in claim 13 wherein the optical element is a lens.

22. The imaging device as recited in claim 13 wherein further comprising membranes supporting the optical element.

23. The imaging device as recited in claim 13 further comprising a control element assigned to the sensor for adjusting the position of the optical element via the actuator element.

24. An imaging device for a printing form, the imaging device comprising:
    a light source;
    an actuator element;
    an imaging optics for projecting the light source onto the printing form, the imaging optics including at least one optical element movable by the actuator element, the imaging optics including a sensor for measuring an actual position of the optical element; and
    a control element assigned to the sensor for adjusting the position of the optical element via the actuator element;
    wherein the control element includes a state-space controller for determining a necessary voltage for a setpoint position of the optical element and a monitoring element for calculating a velocity and a current from an actual position measurement of the sensor.

* * * * *